(12) United States Patent
Tsironis

(10) Patent No.: US 9,620,842 B1
(45) Date of Patent: Apr. 11, 2017

(54) COMPACT TWO PROBE IMPEDANCE TUNER

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 54 days.

(21) Appl. No.: 14/820,775

(22) Filed: Aug. 7, 2015

Related U.S. Application Data

(60) Provisional application No. 62/034,201, filed on Aug. 7, 2014.

(51) Int. Cl.
*H03H 7/38* (2006.01)
*H01P 3/08* (2006.01)
*H01P 5/04* (2006.01)
*G01R 35/00* (2006.01)
*H03H 7/40* (2006.01)

(52) U.S. Cl.
CPC .............. *H01P 5/04* (2013.01); *G01R 35/005* (2013.01); *H01P 3/087* (2013.01); *H03H 7/40* (2013.01)

(58) Field of Classification Search
CPC ............. H03H 7/38; H03H 7/40; H01P 3/087
USPC ................... 333/17.3, 263, 32, 33, 238, 246
See application file for complete search history.

(56) References Cited

U.S. PATENT DOCUMENTS 9,041,498 B1 * 5/2015 Tsironis ................. G01R 27/32
  333/17.3
2009/0231054 A1 * 9/2009 Boulerne ........... G01R 31/2601
  333/17.3

* cited by examiner

*Primary Examiner* — Stephen E Jones

(57) ABSTRACT

An automated "double-decker" slide screw impedance tuner uses two tuning probes, independently movable inside two stacked circular slablines, which lie flat on the bench table. The eccentrically self-rotating disc probes are mounted at the end of rotating radial arm-carriages, the total mechanism operating in a planetary configuration. The radial arms are mounted one above and one below the whole structure. The rotation of the arms control the phase of Gamma and the self-rotation of the disc probes controls the amplitude. The length (footprint) of the tuner, compared with traditional "linear" tuners, is reduced by a factor of 5 to 9, depending of the minimum frequency of operation.

11 Claims, 15 Drawing Sheets

(section A-B of Figure 5)

FIG. 8 (section A-B of Figure 5)

COMPACT TWO PROBE IMPEDANCE TUNER

PRIORITY CLAIM

This application claims priority on provisional application 62/034,201, filed on Aug. 7, 2014, titled "Compact Two Probe Impedance Tuner".

CROSS-REFERENCE TO RELATED ARTICLES

1. Load Pull Measurements, http://en.wikipedia.org/wiki/Load_pull.
2. "Computer Controlled Microwave Tuner—CCMT", Product Note 41, Focus Microwaves, January 1998.
3. Standing wave ratio, VSWR, https://en.wikipedia.org/wiki/Standing_wave_ratio.
4. "High Resolution Tuners Eliminate Load Pull Performance Errors", Application Note 15, Focus Microwaves, January 1995.

BACKGROUND OF THE INVENTION

This invention relates to RF load and source pull testing of medium and high power RF transistors and amplifiers using remotely controlled electro-mechanical impedance tuners.

Modern design of high power RF amplifiers and mixers, used in various communication systems, requires accurate knowledge of the active device's (microwave transistor's) characteristics. In such circuits, it is insufficient for the transistors, which operate in their highly non-linear regime, close to power saturation, to be described using non-linear numeric models.

A popular method for testing and characterizing such microwave components (transistors) in the non-linear region of operation is "load pull". Load pull is a measurement technique employing microwave tuners and other microwave test equipment (FIG. 1), such as signal source (1), input and output tuner (2, 4), power meter (5) and test fixture (3) which includes the DUT. The tuners and equipment are controlled by a computer (6) via digital cables and communication (7, 8, 9). The microwave tuners are used in order to manipulate the microwave impedance conditions under which the Device Under Test (DUT, or transistor) is tested (see ref. 1); this document refers hence to "impedance tuners", (see ref. 2), in order to make a clear distinction to "tuned receivers (radios)", popularly known elsewhere also as "tuners", because of the included frequency tuning circuits.

Electro-mechanical impedance tuners (FIG. 2) in the frequency range of interest include, a slabline (26) with a center conductor (27) and one or more mobile carriages (28) which carry a motor (24), a vertical axis (23) and control the vertical position (29) of a reflective (tuning) probe (22). The carriages are moved horizontally by additional motors and gear. The signal enters into one, the test port (201), and exits from the other, the idle port (202). The entire mechanism is, typically, integrated in a solid housing (203) since mechanical precision is of highest importance.

The typical configuration of the reflective (tuning) probe inside the slabline is shown in FIGS. 3 and 4; in general, a slotted transmission airline (34) includes a number of parallel tuning elements (31) also called "tuning" probes or slugs, which are coupled capacitively (gap [D]) with the center conductor to an adjustable degree (34), depending from very low (when the probe is pulled up, or 'withdrawn') to very strong (when the probe is within corona discharge (spark) distance from the center conductor); tuning ('reflective') probes are different than 'signal sampling' probes, which are loosely coupled with the center conductor and not grounded, because they must transfer the detected signal power to adjacent measurement instruments; when the reflective probes approach (34) the center conductor (33) of the slabline (34) and moved along the axis (35) of the slabline, they modify the amplitude and phase of the reflection factors, covering parts or the totality of the Smith chart (the normalized reflection factor plan). The relation between reflection factor and impedance is given by GAMMA=(Z-Zo)/(Z+Zo), wherein Z is the complex impedance Z=R+jX and Zo is the characteristic impedance. A typical value used for Zo is Zo=50 Ohm (see ref. 3).

Up to now such metallic probes (slugs) have been made in a block (parallelepiped) form (31) with a concave bottom (402) (FIG. 4), which allows capturing, when approaching the center conductor (401), the electric field, which is concentrated sidewise in the area which is closest between the center conductor and the grounded sidewalls of the slabline, and reflect most of the signal power back. This field capturing allows creating high and, through accurate positioning of the probe, controllable reflection factors. Contact of the probes with the sidewalls (40, 44) (FIG. 4) is critical. It can be either capacitive (44) (FIG. 4b) or galvanic (40) (FIG. 4a). If the contact is capacitive (FIG. 4b), the surface of the probes facing the slabline walls and/or the sidewalls of the slabline must be electrically insulated and perfectly smooth and parallel to each other. Insulation can be done using chemical process such as anodization. Nevertheless capacitive contact means extreme requirement in sidewall planarity and straightness to keep the capacitive contact constant for the whole length and depth of the slabline as the probe travels.

Galvanic contact (FIG. 4a) is safer, but requires a spring loaded mechanism to allow for continuous pressure of the probe on the sidewalls and reliable ground sliding contact. The springing mechanism (41) of probe 4a) is created by machining a horizontal hole (42), parallel to the center conductor of the slabline, into the body of the probe and leave a thin strip of metal at the sides to act as spring. Probe 4b) instead can be massive (45).

BRIEF DESCRIPTION OF THE SEVERAL VIEWS OF THE DRAWINGS

The invention and its mode of operation will be more clearly understood from the following detailed description when read with the appended drawings in which.

DETAILED DESCRIPTION OF THE INVENTION

Figure 1:
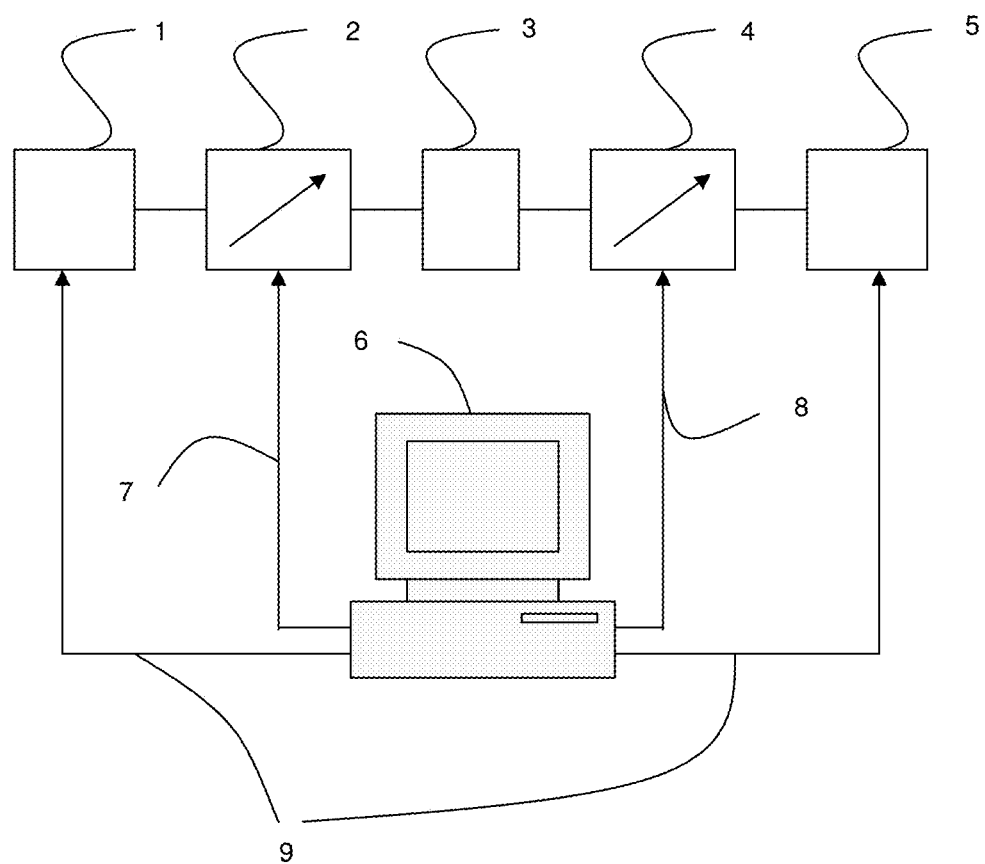
FIG. 1 depicts prior art, a typical automated transistor load pull test system.

This invention discloses a new low footprint slide screw impedance tuner comprising two independent tuning probes, the compact two-probe circular tuner. The essential components of this new structure are:

a. A double-decker (sandwich) set of circular horizontal slablines with circular (toroid) center conductors.
b. Two independently driven eccentrically rotating disc-(tuning) probes.
c. Two mobile carriages in form of independently driven and rotating radial arms.
d. Stepper motors, electronic control and mechanical control gear.

The effect of using the new structure is reducing the overall horizontal length (footprint) of a prior art (linear) two-probe tuner by a factor, which depends on the minimum frequency of operation, and ranges between 9.5 (at Fmin=100 MHz) and 4.2 (at Fmin=800 MHz); (compare FIGS. 2 and 8 and see ref. 2); table I summarizes this:

TABLE I

Comparison of total length of prior art linear and new circular two-probe tuners

| Minimum Frequency [MHz] | Prior art Tuner Length [cm] | New Circular Tuner Length [cm] | Shrinking ratio in Length |
| --- | --- | --- | --- |
| 100 | 313 | 32.9 | 9.5 |
| 200 | 163 | 21 | 7.8 |
| 400 | 88 | 14.9 | 5.9 |

TABLE I-continued

Comparison of total length of prior art linear and new circular two-probe tuners

| Minimum Frequency [MHz] | Prior art Tuner Length [cm] | New Circular Tuner Length [cm] | Shrinking ratio in Length |
| --- | --- | --- | --- |
| 600 | 63 | 12.9 | 4.9 |
| 800 | 50 | 11.9 | 4.2 |

The shrinking ratio decreases with increasing minimum frequency, since the contribution of the required horizontal electrical travel length ($\lambda/2$) to the overall tuner length relative to the carriage width (28) and connectors and sidewalls (201, 202, 203), increases with decreasing frequency (FIG. 2); these components are a fixed contribution to the overall length which decreases, in relative terms, with decreasing frequency. In the case of the circular tuner the connectors (72) in FIG. 7, do not add to the overall length (507), because they are facing the front and not the sides; instead the rotating motors (57) on both sides (FIG. 8) do add to the overall size (diameter).

Figure 12A:
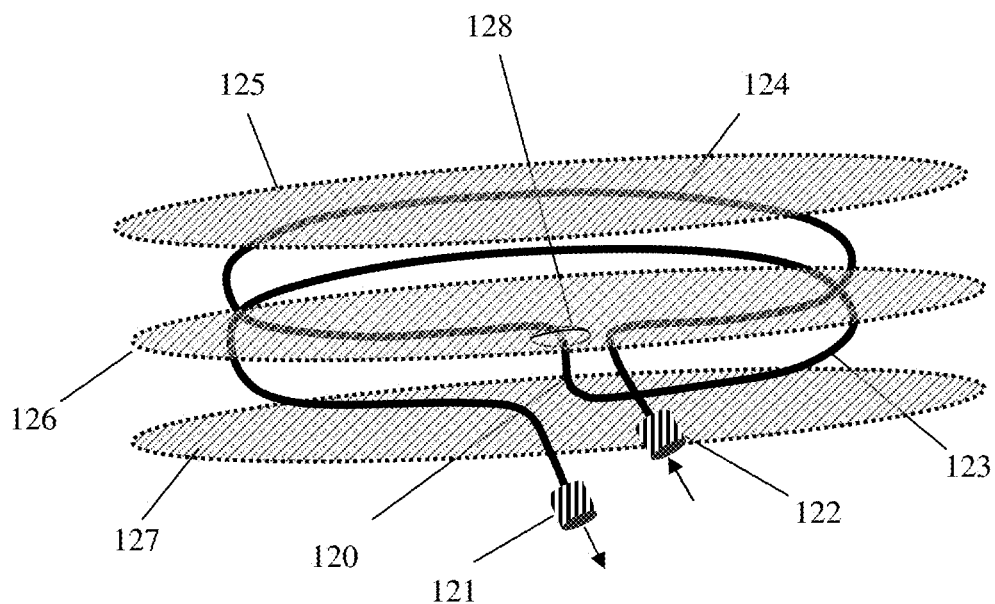
FIG. 12*a*) through 12*b*): 12*a*) depicts a schematics 3D view of the helix (spiral) of the center conductor of the slabline of the two-probe circular tuner; the vertical transition (item 120) is also shown in FIG. 11. 12*b*) depicts alternative configuration of the trajectory of the center conductor.
Figure 12B:
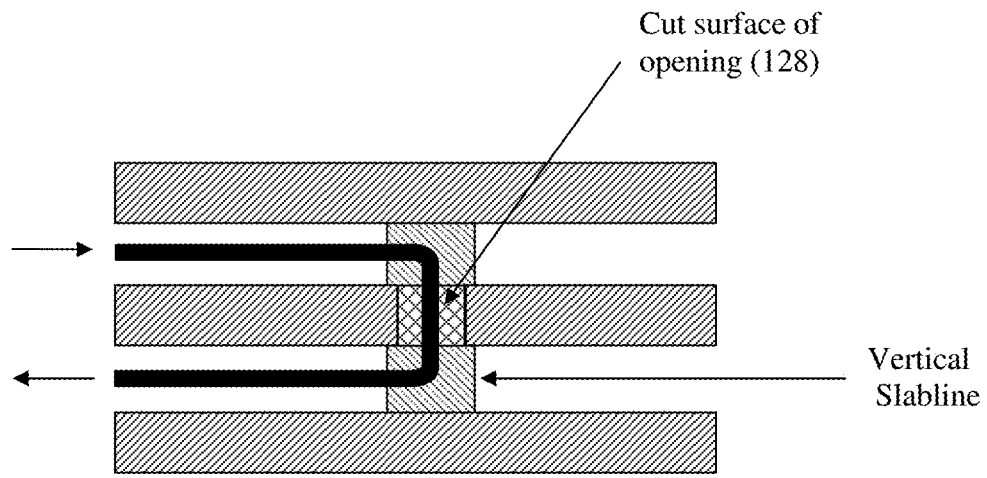

The circular two-probe tuner (FIGS. 5, 8 and 9) comprises two stacked slablines made of two metallic discs each (503); see FIGS. 12*b*) and 14; the slablines comprise a top and bottom disc each. The top disc of the lower slabline (810) is the bottom disc of the top slabline; each set of slabline discs is held together by a disc formed spacer (811); the center conductor of either slabline is a circular rod (86) which has the form of a toroid and follows the periphery of the spacer (811) and is held in place by a number of supporting dielectric studs (52), (812) distributed on the periphery of the spacers (811). The spacers (55), (811) themselves have a diameter which is smaller than the diameter of the center conductor ring (toroid) (53) in order to avoid interfering and disturbing the electromagnetic field, which propagates between the center conductor and the slabline sidewall discs, and creating not negligible residual reflection when the tuning probes (56), (80), (807) are withdrawn from the slablines; a typical value of such diameter reduction is about two times the width of the channel of the slabline.

Figure 5:
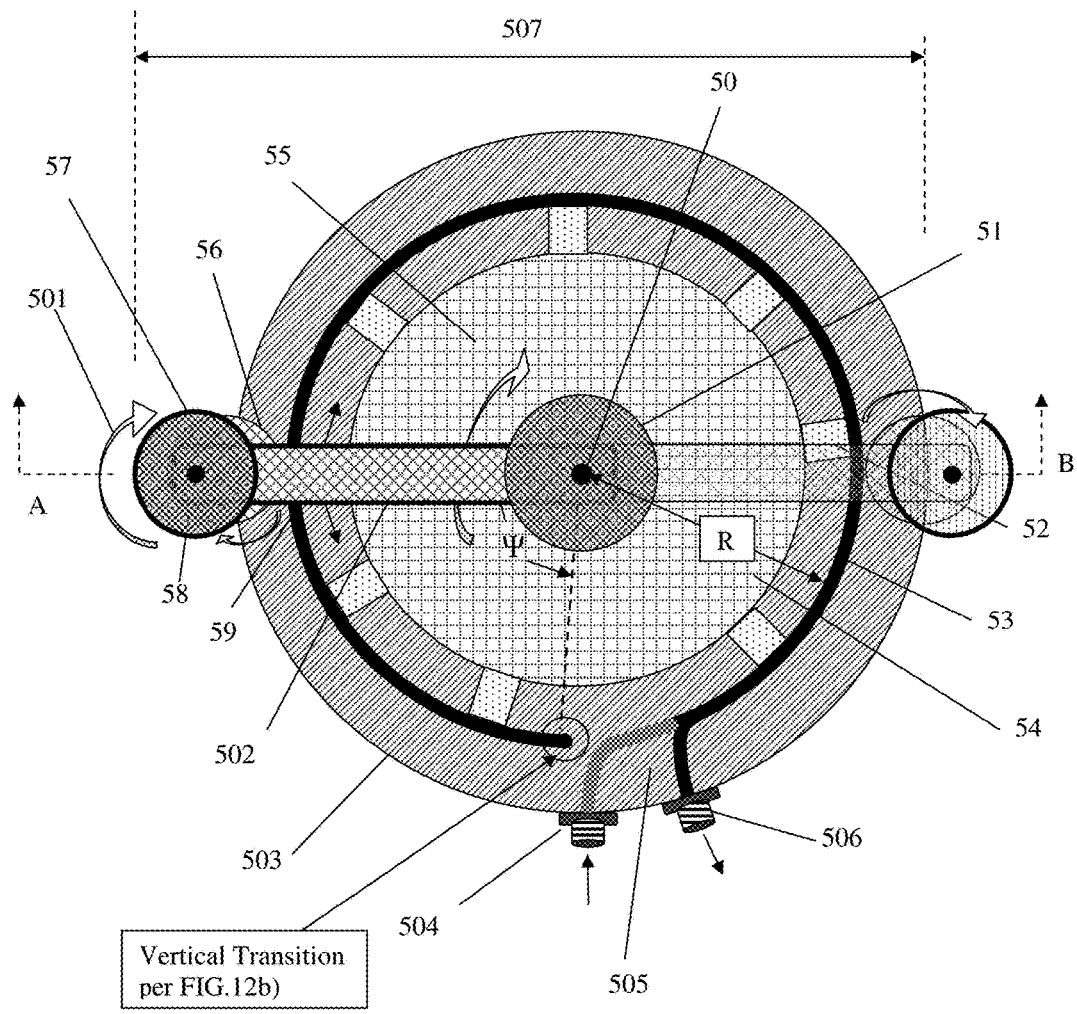
FIG. 5 depicts top view of circular compact tuner (arm-carriages set, arbitrarily, at 180 degrees opposite).
Figure 9:
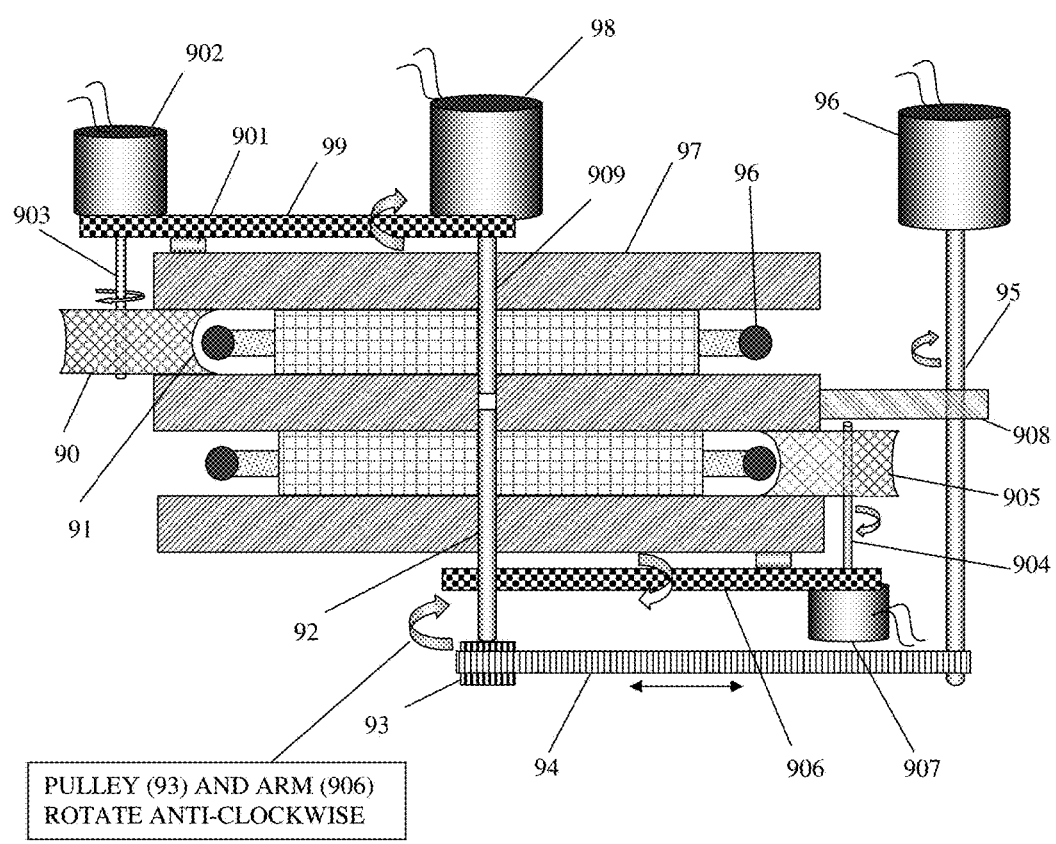
FIG. 9 depicts a different configuration of the two-probe circular tuner, with the second carriage motor mounted top wise.
Figure 10:
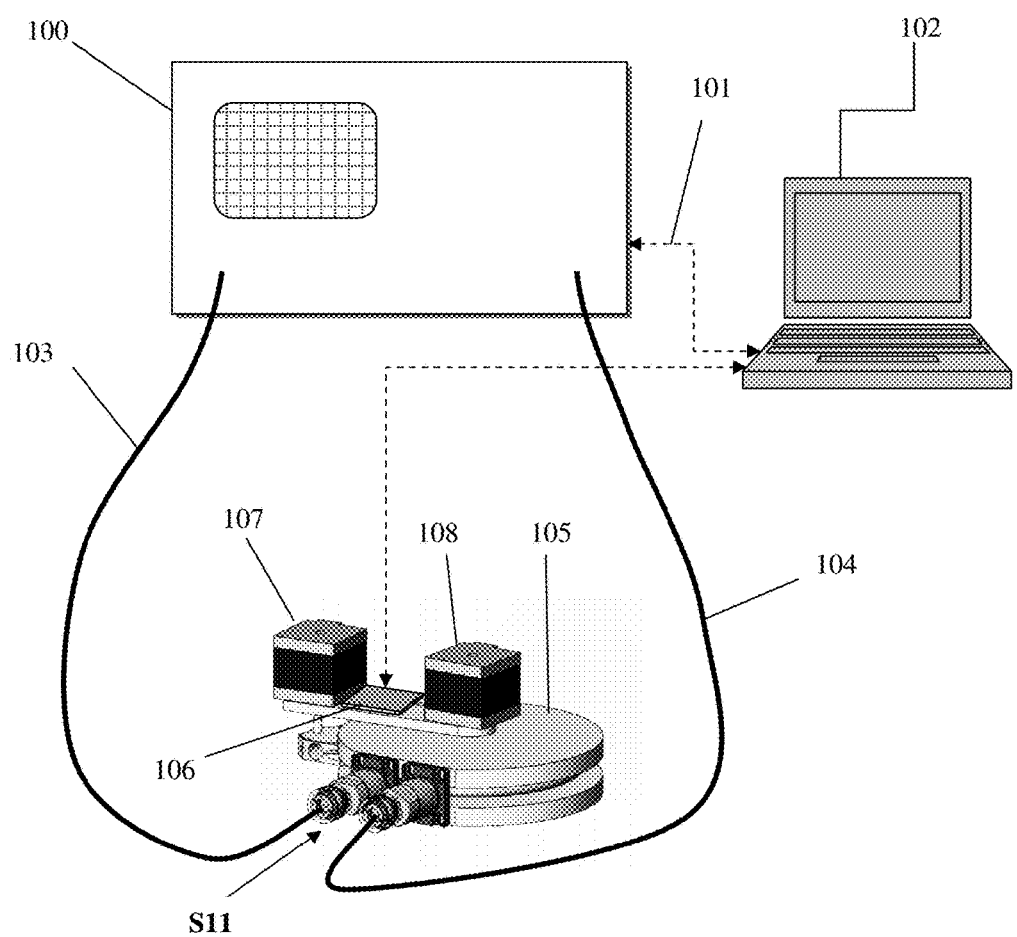
FIG. 10 depicts a test setup used to calibrate the circular tuner on a network analyzer.

A vertical axis (50), (809) is anchored into the center of the bottom and top metallic discs (503), (87) and the spacers (53), (811) and guides the mobile arm (502), which (optionally) carries also the motor control electronic board between the two motors (51) and (57) (shown in FIG. 10 as item (106)); FIG. 5 shows the top view whereas FIGS. 8 and 9 show a cross section A-B.

Figure 8:
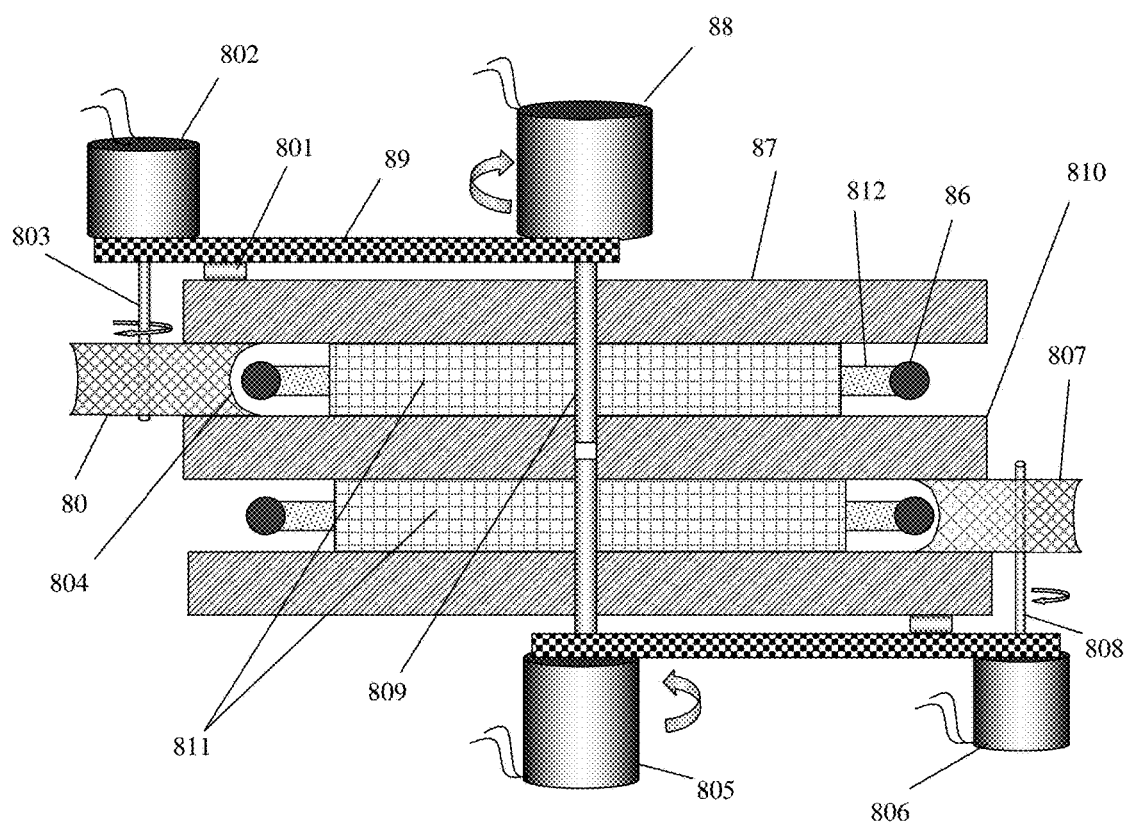
FIG. 8 depicts a cross section of a two-probe circular tuner. The probes are shown at 180 degrees opposite for better view and appreciation of the maximum tuner size, this being only a specific, not typical state. Any angle is possible.

The cross section of the two-probe circular tuner is shown in FIGS. 8 and 9. Whereas in FIG. 8 the second "horizontal" motor (805) is shown upside down on the bottom of the tuner, in FIG. 9 it is shown, more realistically, mounted on the side (96), supported by the member (908), which allows the rotation of the arms (99) and (906) and driving (93) the axis (92) using and extended shaft (95) and a timing belt (94). Axes (92) and (909) rotate independently. Obvious alternative embodiments are possible which would allow mechanisms to rotate the arms (99) and (906), which carry the "vertical" motors (902) and (907) correspondingly. The configuration of FIGS. 8 and 9 show the secondary "vertical" motors (802, 806) in anti-diametric position for a better view of the mechanism and to show the maximum size of the tuner in FIGS. 8 and 9, but of course any relative angle is possible and they may as well overlap, since the design does eliminate mechanical conflict. The rotation limits of each arm (corresponding to the "horizontal" carriage movement of a prior art "linear" tuner) are between the center conductor bend towards the coaxial connectors (121, 122) and the vertical transition (128) shown in FIG. 12. The center conductor (86) continues un-interrupted from the top to the bottom slabline using the vertical transition (112) in FIG. 11; obviously the trajectory of center conductor must be perfectly circular to allow constant gap with the probes (80) and (807) as they rotate around the axis (809). This can be achieved using a perfectly circular dielectric support (811) and properly dimensioned and placed spacers (52) in FIG. 5 and (812) in FIG. 8.

Figure 6:
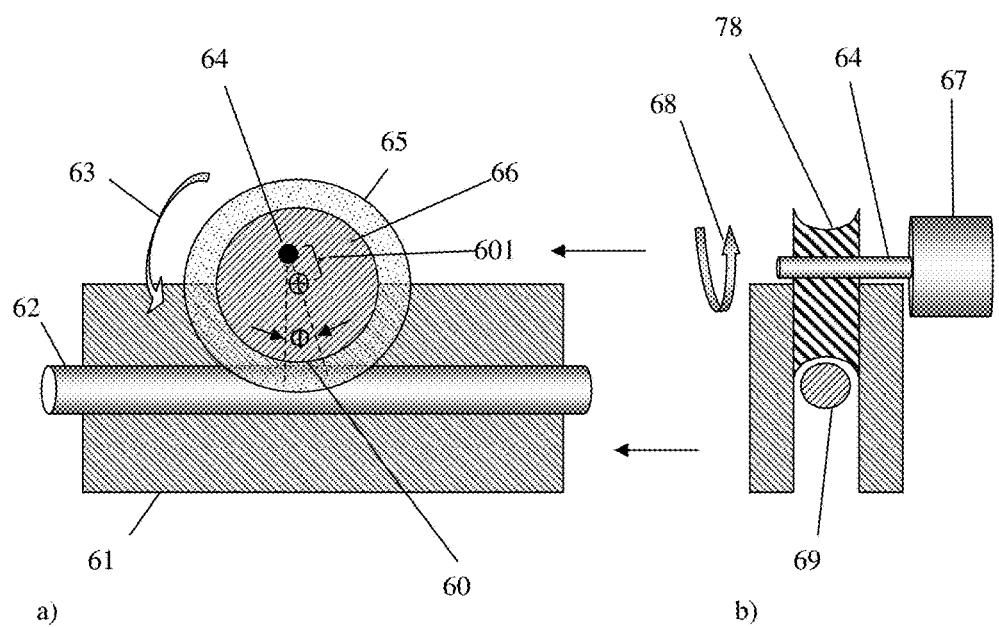
FIG. 6 depicts: (a) frontal view and (b) cross section view of the eccentrically rotating disc-probe and its operation inside the circular slabline of FIG. 5.

The detailed mechanism of the two probe tuner is fully described in two basic embodiments in FIGS. 6, 8 and 9. Motor (88) rotates with the arm (89) around the axis (809); at the end of the arm (89) is amounted a second motor (802) which carries on its axis (803) a metallic disc probe (80). Probe (80) rotates eccentrically (see FIG. 6): by rotating probe (65) causes its peripheral groove (78) enter into or withdraw from the slabline (61) and approach gradually the center conductor (69) thus changing the amplitude of the reflection factor GAMMA. The arm (89) is supported by a rolling bearing (801) in order to maintain the vertical position of the probe (80) centered inside the slabline (87). FIGS. 5 and 8 depict various views and details of the same mechanism and shall be considered together.

FIG. 9 depicts a different embodiment that FIG. 8, in the sense that the second "horizontal" motor (96) is transferred to the upper level for easier assembly, smaller volume and operation control. The lower slabline axis (92) is driven by a belt mechanism (94) from the axis (95) of the second motor (96). Otherwise all other elements are the same as in FIG. 8.

Figure 11:
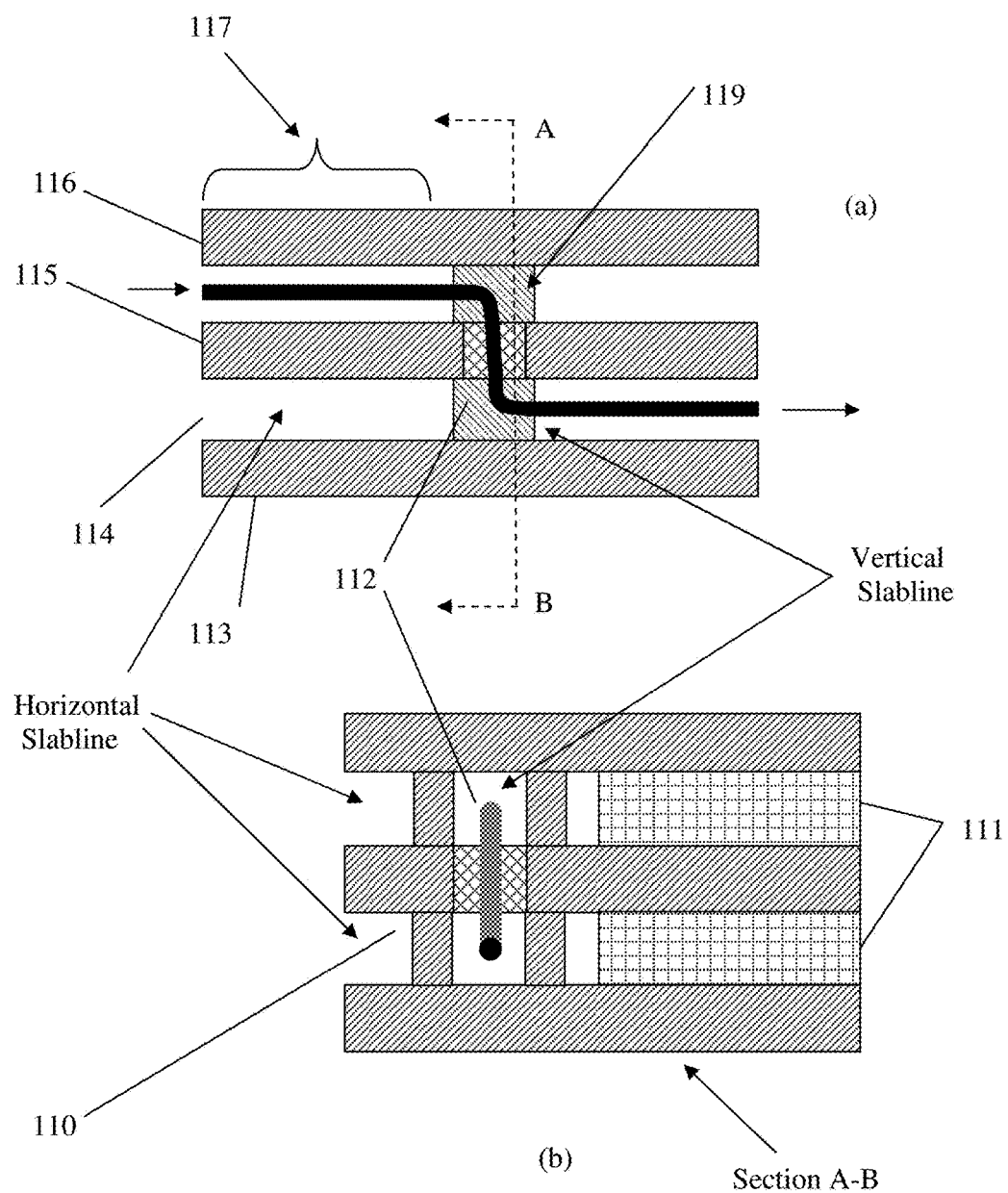
FIG. 11 depicts a detail of the double spiral slabline: a frontal and cross section of the vertical transition between the two toroid center conductors.

The two stacked slablines only require three metallic sidewall discs, since the center one (810) is common to both (FIG. 8); and two spacers (811); the spacers can be dielectric or conductive; the important issue is that their diameter is small enough, compared with the diameter of the center conductor toroid, that they do not affect the electric field. The center conductors (123) and (124) of both slablines (125-126) and (126-127) run in concentric spiral form (FIG. 12). Whereas understanding the concept is straight forward regarding each particular circular slabline, the transition between levels is not. It requires a low reflection vertical connection (120), (128) between levels; this is shown in detail in FIG. 11: FIG. 11a) shows a side view and FIG. 11b) a front view of the transition. The center conductor (114) is bent 180 degrees from the top slabline (116-115) to the bottom one (113-115); both slablines are separated by the center disc (115) and two spacers (111). The top and bottom slablines are horizontal. However the transition (112), (119) is vertical. The center conductor is guided through a hole (119) in the center disc (115). The dimensions of both horizontal and vertical slabline sections are optimized to create a wideband matched transition with minimum reflection and the same characteristic impedance Zo as the top and bottom slablines; typical Zo values are 50 Ohm.

FIG. 12 is an illustration of the shape of the center conductor in the stacked slablines. The center conductor is best made using the same wire diameter. This simplifies the transitions and eliminates premature cut-off phenomena in the transmission line. The continuous rod has an upper segment (124) and a lower segment (123). They are shaped circular; the vertical transition between both segments is in (120). The end of each segment is bent outwards and connects to the center conductor of a coaxial connector (121, 122). One connector is used as input (or test) port and the other as output (or idle) port. For clarification of the illustration the three grounded discs placed above the top conductor segment (125), between both segments (126) and below the bottom segment (127) are shown schematically. The hole (128) in the middle disc is shown to allow the center conductor to traverse from top to bottom.

Figure 7:
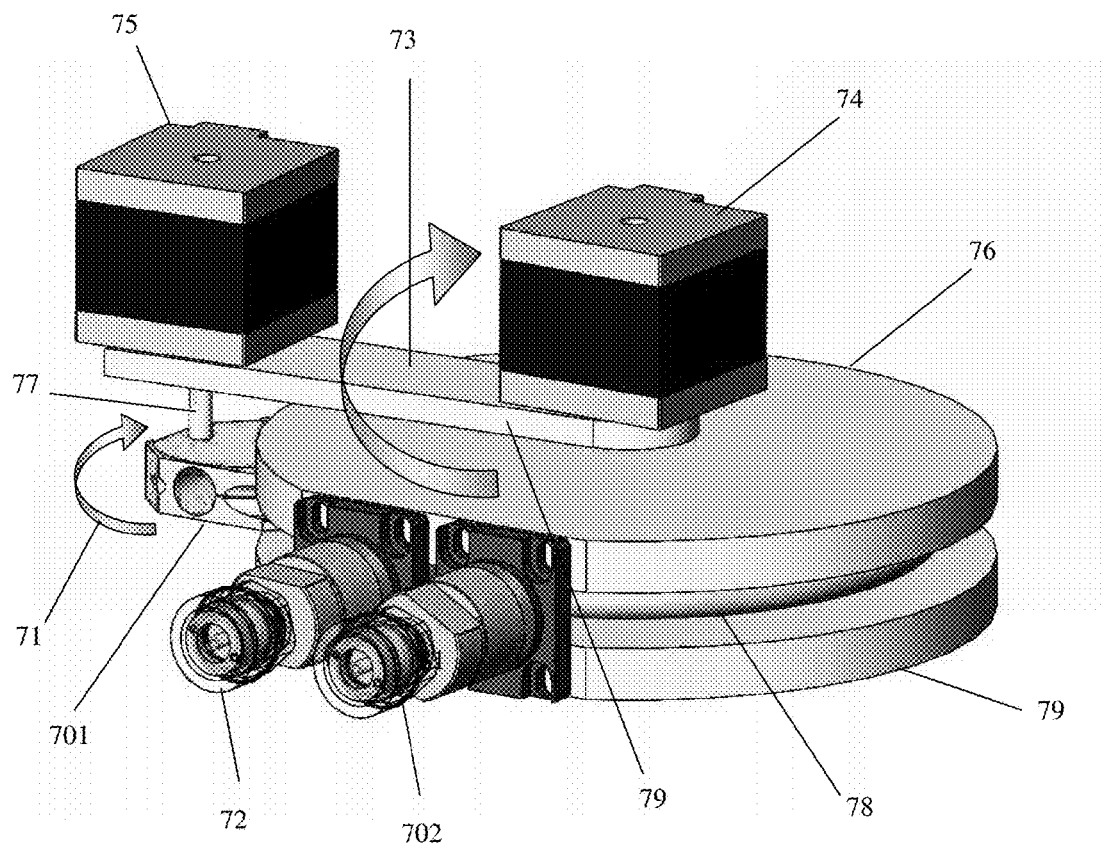
FIG. 7 depicts a perspective view of a one probe circular tuner.

A perspective view of one stage of the circular tuner is shown in FIG. 7: all parts mentioned before are visible: Motor for phase control Ψ (74) and amplitude control Φ (75) of GAMMA; top (76) and bottom (79) plates of the top slabline; center conductor (78); axis (77) and disc-probe (701); rotating arm (73) and input (72) and output (702) coaxial ports; in the double decker slabline the output port (702) is connected at the lower level.

The tuner calibration process uses a setup as in FIG. 10: The stepper motors (107, 108) are directed by the control board (106) which communicates with the computer (102) to rotate the disc probes into the slot of the slabline in order to increase the GAMMA value, while reading the four scattering parameters (s-parameters) from the VNA (100) using standard communication cable (101) and protocol. The calibration comprises two main steps: a) the scaling step at the fundamental frequency Fo, and b) the calibration step at a set of frequencies selected. These can be fundamental frequency only, or fundamental and one harmonic frequency or any other arbitrary set of two frequencies inside the tuning frequency range of the tuner. Typically the frequencies Fo, or Fo and 2Fo, or Fo and 3Fo are selected. The scaling step is executed at Fo, whereby typically 5 to 50 angles of the rotating probes are defined for which the reflection factor at the test port increases from close to 0 to S11.max (close to 1); hereby the rotating arms are set to an initial angle and not moving; in the calibration step both probes and both arms are rotating and s-parameters are measured for the probe angles defined in the scaling step a) and for a multitude of angles of the rotating arms.

S-parameters of the tuner are then measured at Fo only or at Fo and 2Fo or Fo and 3Fo at a multitude of combined angles of each disc-probe and each arm, selected to generate values between minimum and maximum GAMMA and phases covering 360 degrees at Fo on the Smith chart; the data are saved in a calibration file in the form Sij(Φk, Ψk, F), {i,j}={1,2} is the s-parameter index for the S matrix: (S11,S12,S21,S22); k={1,2} k is the index of the probe and arm, and F is the fundamental or harmonic frequency selected. Φk is the relative angle of the probe self-rotation, starting with an initial position (zero), relative to the vertical direction (FIG. 6); and, for each Φk, s-parameters are measured for a multitude of horizontal positions corresponding to the angle Ψk of the axis of the rotating arm (502) between a starting angle Ψk=0, and Ψk.max, whereby Ψk.max corresponds to one half of a wavelength arc at the periphery at the selected frequency (Ψk.max=λ/(2πR), FIG. 5. This procedure is repeated for each frequency of interest (F) and the data are saved for later use. The total number of disc-probe angle and arm angle permutations correspond to distinct tuner states and is between 400 and 1500. This number is used further down and is denominated as N (for probe 1) and M (for probe 2).

For probe de-embedding both probes are withdrawn from the slabline and s-parameters of the tuner two-port are measured and saved in a initialization matrix [S0]; then all s-parameter sets associated with probe 2 are cascaded with the inverse matrix $[S0]^{-1}$ and the result for probe 2 is saved. Finally all permutations of full s-parameters of probe 1 and de-embedded s-parameters of probe 2 are cascaded and saved in a combo calibration file containing N×M s-parameter data points, whereby N is the number of states for probe 1 and M the number of states for probe 2.

Impedance synthesis using s-parameters of pre-calibrated tuners is a specific search procedure related to slide-screw tuners in general, the basic concept of which has been used before. This does not, however, limit the scope of the invention itself, since the procedure applies to the new planetary configuration of the two layer tuner using rotating arm carriages and cascaded rotating disc-probes disclosed here; this will be described below. The calibration procedure has been laid out in order to underline the fact that this wideband tuner can be used either for single, high Gamma, or for a two frequency impedance synthesis (harmonic or not), when calibrated and the calibration data used accordingly.

Figure 15:
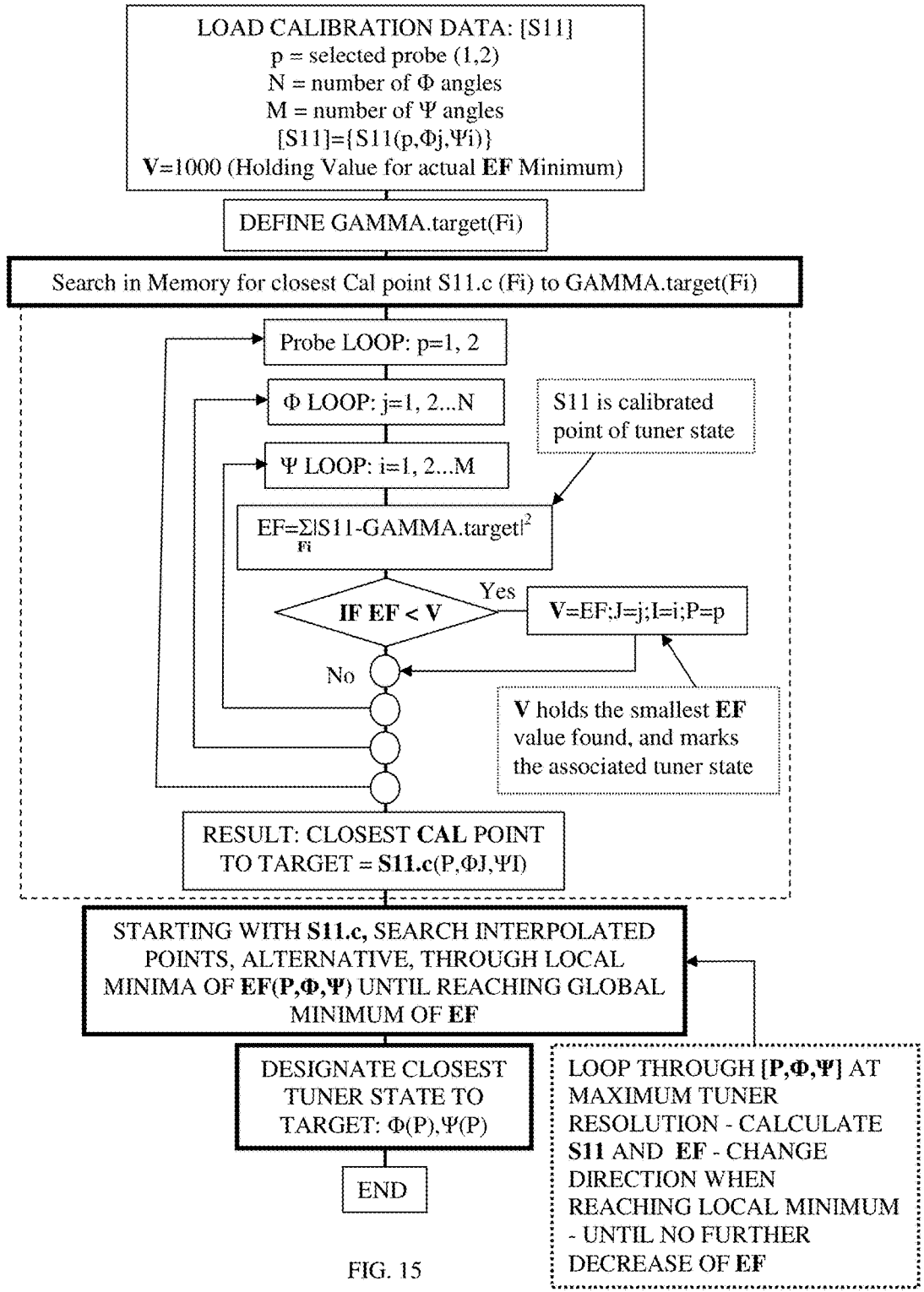
FIG. 15 depicts the flowchart of impedance synthesis (tuning) procedure of two probe circular tuner; the method is applicable for single or two frequency tuning.

When an impedance (or GAMMA) synthesis (tuning) is requested by a user, the computer loads the calibration data from the hard-disk into its active memory and scans through them to find the closest match between a calibrated impedance (GAMMA) point and the requested impedance (GAMMA). After this first step a second search is performed in intertwined successive search loops (FIG. 15), in which interpolated data between calibration points are used (see ref. 4) and a final match is found, usually very close within approximately 1% or better, in reflection factor terms, of the requested impedance value. The error function to minimize is defined as the sum, over all Fi, of the vector differences between target and interpolated reflection factor over all frequencies in consideration. If one frequency is considered, we speak of fundamental tuning, if two harmonic frequencies are considered (Fo and 2Fo, or Fo and 3Fo) we speak of harmonic tuning, if just two arbitrary frequencies are considered, we speak of multi-frequency tuning: EF=Σ|GAMMA.target(Fi)−GAMMA.tuned(Fi)|$^2$, whereby the reflection factor is a vector: GAMMA=|GAMMA|*exp(j<GAMMA>), whereby <GAMMA> is the angle of the reflection factor.

The following procedure is executed for each operation frequency: The interpolated complex s-parameters (S11, S12,S21,S22) with Sij=|Sij|*exp(j<Sij>), of the tuner are calculated for an arbitrary state (Φ, Ψ) using a set of the 9 vectorially closest calibrated states and the following interpolation formulas:

$$Sij(\Phi,\Psi k)=A(\Phi)*Sij(\Psi k,\Phi 1)+B(\Phi)*Sij(\Psi k,\Phi 2)+C(\Phi)*Sij(\Psi k,\Phi 3), \quad (1)$$

$$Sij(\Phi,\Psi)=A(\Psi)*Sij(\Psi 1,\Phi)+B(\Psi)*Sij(\Psi 2,\Phi)+C(\Psi)*Sij(\Psi k3,\Phi), \quad (2)$$

whereby {i, j}={1,2} and k={1,2,3}. The coefficients A, B, C are calculated using the following relations:

$$A(Z),(Z-Z2)*(Z-Z3)/((Z1-Z2)*(Z1-Z3)); \quad (3)$$

$$B(Z),(Z-Z1)*(Z-Z3)/((Z2-Z1)*(Z2-Z3)); \quad (4)$$

$$C(Z),(Z-Z2)*(Z-Z1)/((Z3-Z2)*(Z3-Z1)); \quad (5)$$

whereby Z can be replaced in equations (3) to (5) by Φ or Ψ to calculate s-parameters from equations (1) and (2) accordingly; Ψ corresponds to the physical rotation angle of the mobile arm, and thus to the linear distance between the test port and the probe or the equivalent horizontal position of the probe in a prior art linear tuner, and Φ corresponds to the self-rotation of the disc probe and thus to the distance between the bottom of the probe groove and the center conductor inside the slabline. These formulas allow calculating the s-parameters of the tuner using 3 sets of calibrated points (Ψmn, Φmn) with {m,n}={1,2,3}, surrounding the requested target position {Ψ, Φ} on the Smith chart. These 3 sets of points are: point 1: (Ψ1,Φ1), (Ψ1,Φ2), (Ψ1,Φ3); point 2: (Ψ2,Φ1), (Ψ2,Φ2), (Ψ2,Φ3); point 3: (Ψ3,Φ1), (Ψ3,Φ2), (Ψ3,Φ3). The Ψ and Φ values are the angular coordinates of the closest calibrated points to the target reflection factor. They can also be expressed in stepper motor steps (a motor step corresponds to 360°/resolution; typical values are 0.9° or 1.8° per motor step); the choice is adequate because a rotation of the arm (Ψ) changes the distance of the probe from the test port and thus the phase of the reflection factor and a rotation of the probe (Φ) changes the gap between probe and center conductor (FIG. 6) and thus the amplitude of the reflection factor.

Figure 2:
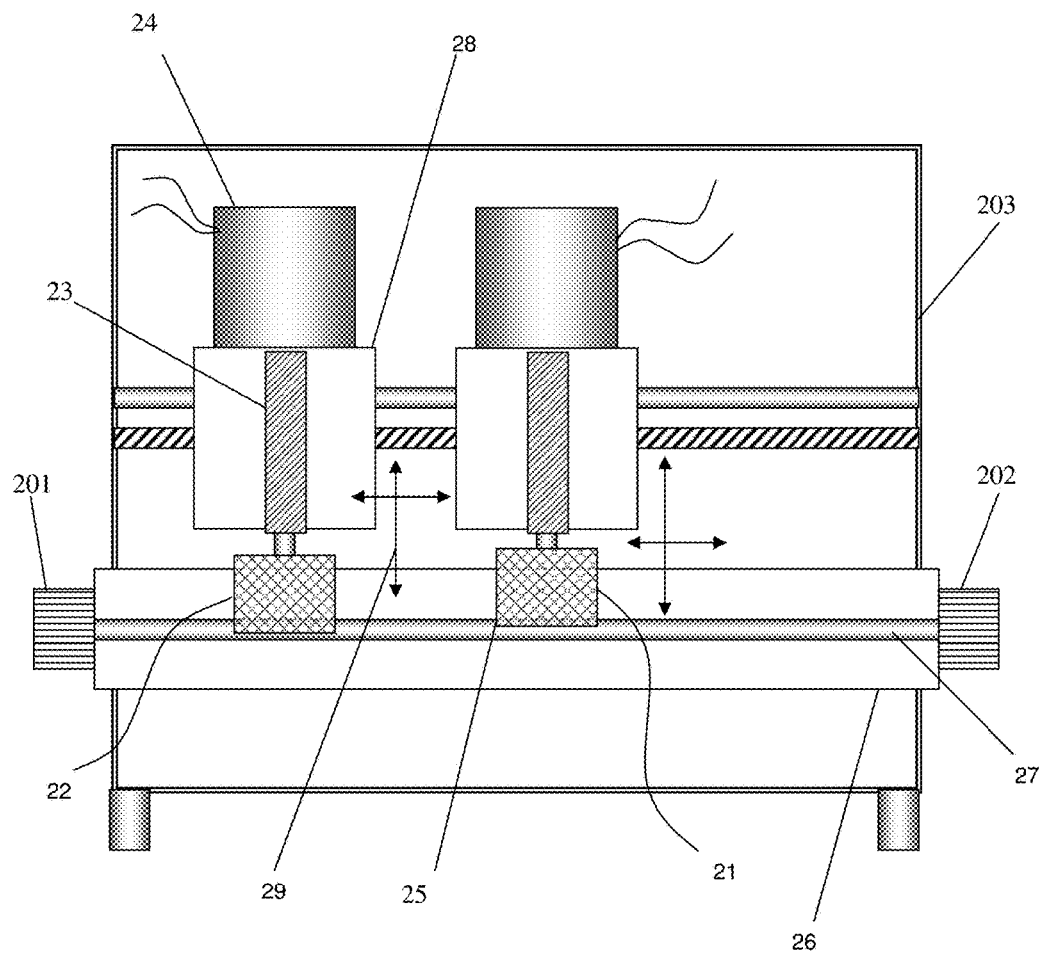
FIG. 2 depicts prior art, a front view of an automated slide screw impedance tuner using two independent carriages and tuning probes (slugs).
Figure 3:
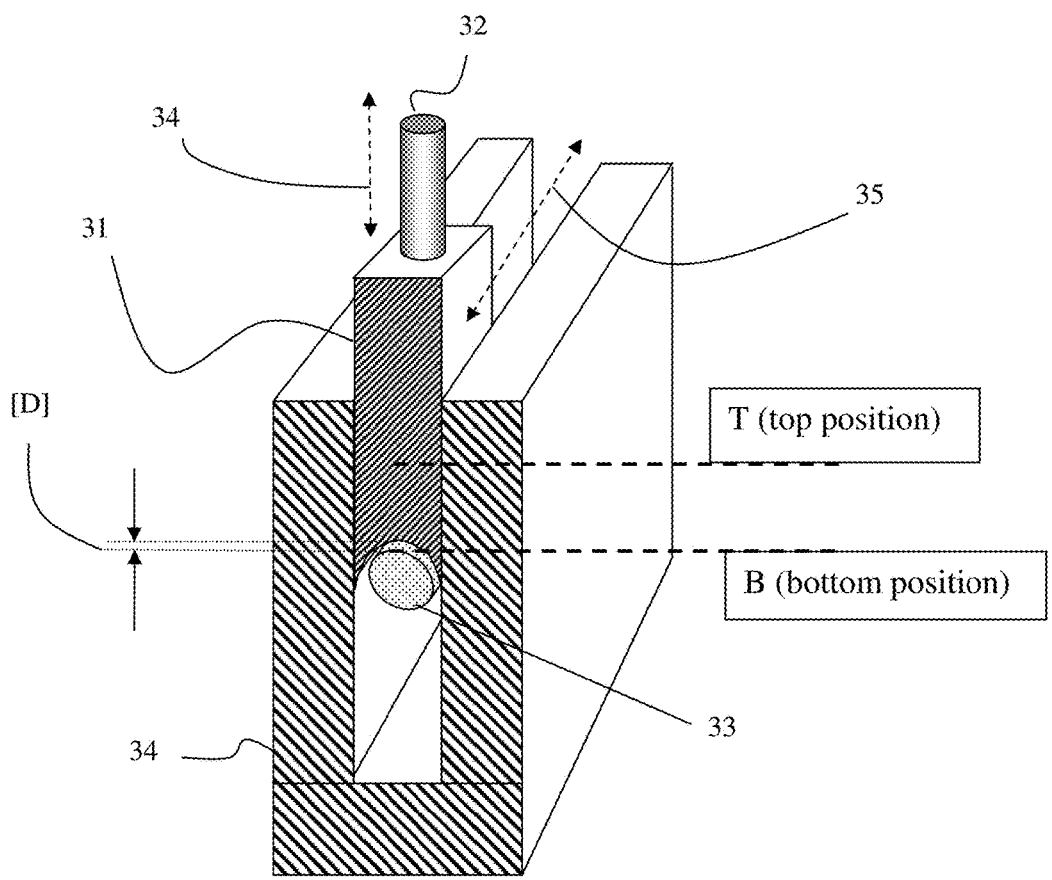
FIG. 3 depicts prior art, parallelepiped formed RF tuning probe (slug) inside a slotted airline (slabline) approaching the center conductor in a perspective view and the relevant movement dimensions and parameters of the operation.
Figure 4:
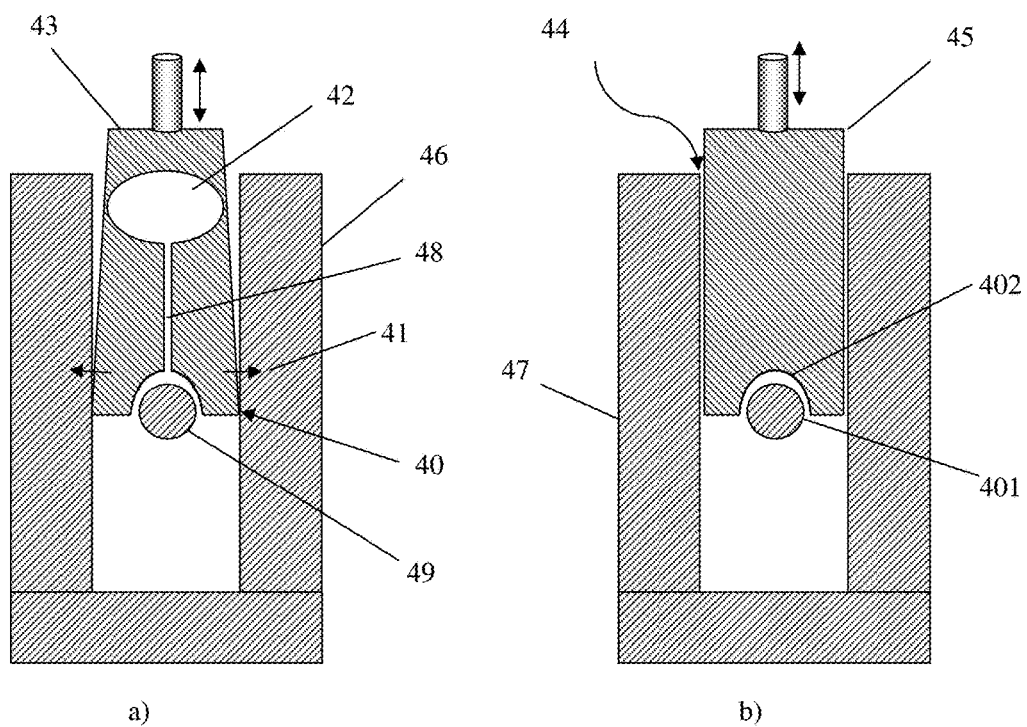
FIG. 4 depicts prior art, cross section of typical tuning probe configurations: a) with spring mechanism and galvanic ground contact with the slabline walls; b) with capacitive RF ground contact.

One basic operational difference between the two-probe tuner shown in FIG. 2 and the hereby disclosed structure is that, whereas in the case of the prior art tuner of FIG. 2 the probes can operate adjacent to each-other at higher frequencies, as long as the starting horizontal position of probe 2 is λ/2 away from the end position of probe 1, in the circular tuner structure (FIGS. 8, 12) the second probe cannot operate closer to the first probe than the vertical transition (128), which is always at least λ/2 at the lowest frequency of operation. This reduces the maximum tuning range (GAMMA.max) of the tuner, due to the insertion loss of the upper slabline section between λ/2 and beginning of slabline 2, but it is be the price to pay for a dramatically reduced footprint, beneficial for compact on-wafer integrations.

Figure 13:
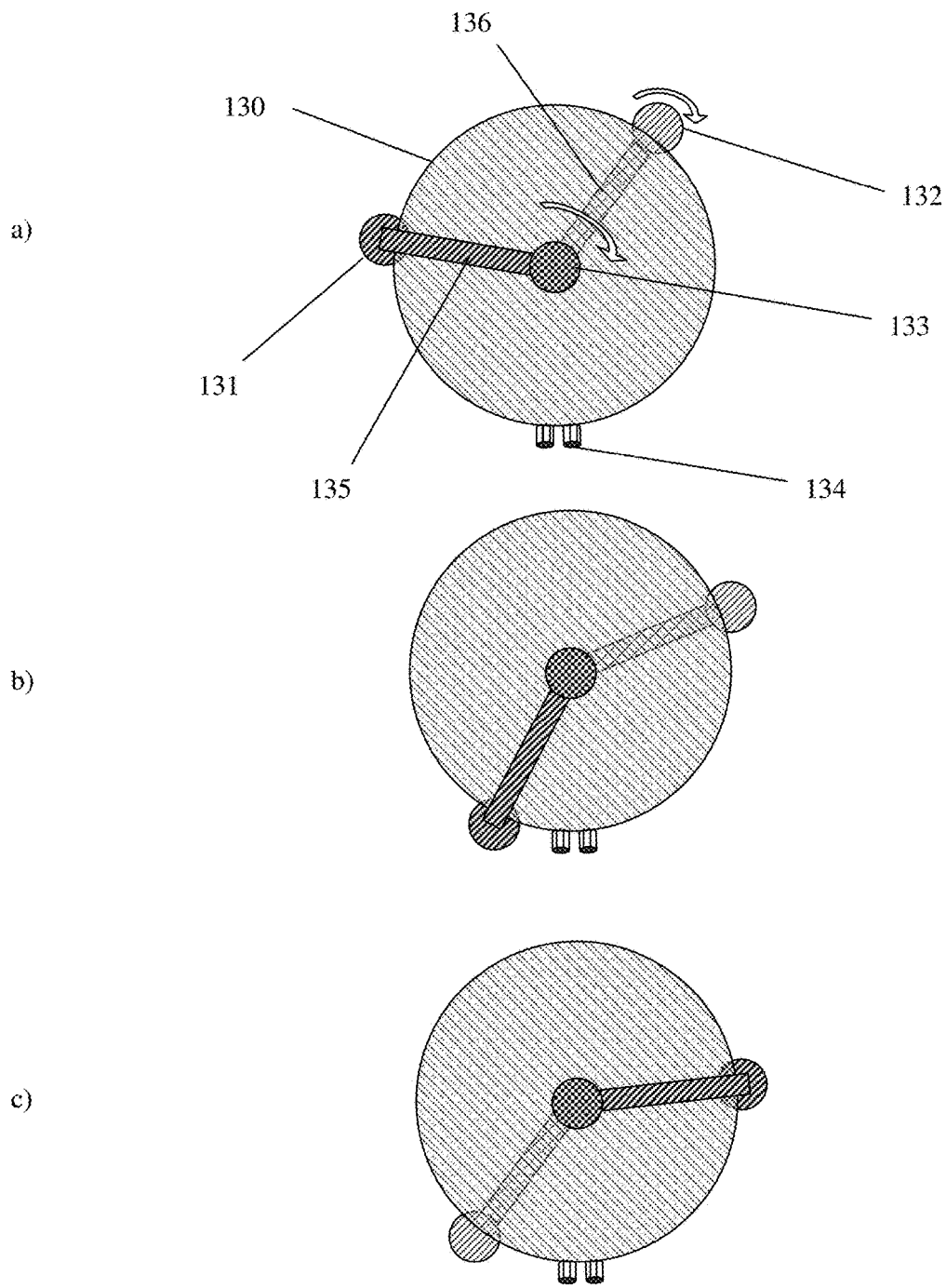
FIG. 13 *a*), *b*), *c*) depict a number of possible positions of the two arms and probes relative to the input and output connectors.
Figure 14:
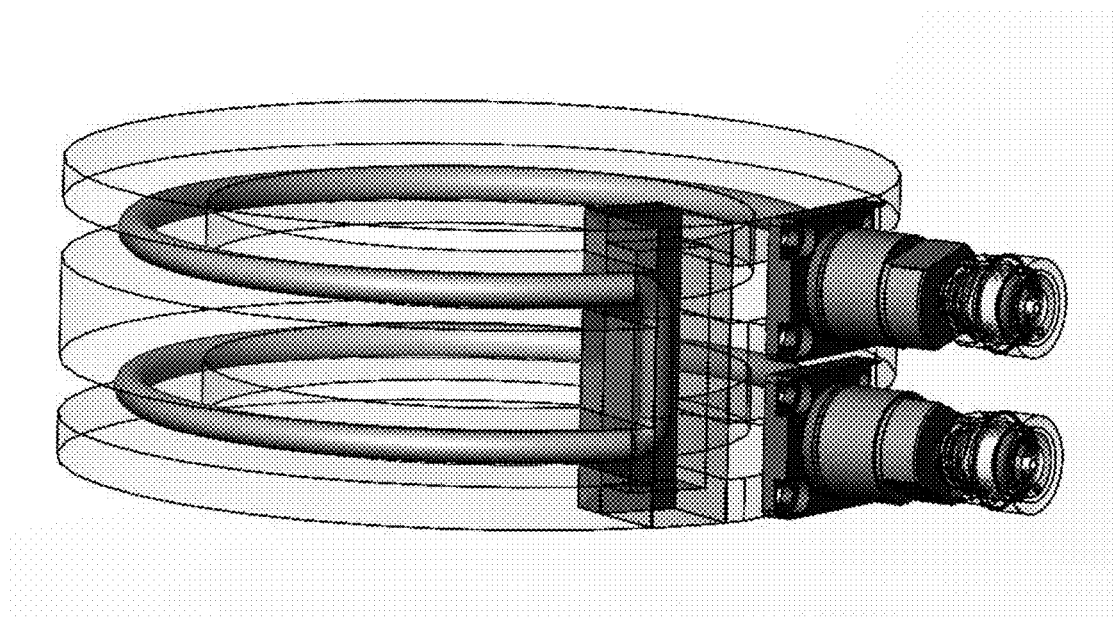
FIG. 14 depicts an alternative perspective view of an assembly of two stacked circular slablines.

FIG. 13 illustrates various possible settings of the two probes, seen from the top, in order to demonstrate the concept: probe (131) is the top probe, probe (132) is the bottom probe; correspondingly arm (135) is the top arm and (136) the bottom arm. (133) is the top main motor (the bottom motor is not shown). The two probes slide across the periphery of the circular slabline (130) and the signal enters and exits from the coaxial ports (134). FIGS. 13 b) and 13 c) show different possible positions of the two probes. The tuner has in fact no distinct physical test and idle ports, both ports are equivalent; it is only for the purpose of calibration and tuning that a port is designated test port and the other idle port. The tuner is symmetrical.

This invention has been described in a basic preferred embodiment; obvious alternatives and configurations, to the disclosed concept of circular compact slide screw tuners using rotating carriages and disc probes, are possible but shall not impede on to the validity of the present invention.

What I claim as my invention is:

1. An automated slide screw impedance tuner, comprising
a test port and an idle port and two circular slablines 1 and 2, stacked above each-other in a sandwich (double-decker) configuration, separated by spacer discs,
whereby the beginning of slabline 1 is associated with the test port and the end of slabline 2 is associated with the idle port,
and spiral formed continuous center conductor of the slablines traversing vertically from the end of slabline 1 to the beginning of slabline 2,
and at least two mobile carriages, one for each slabline,
whereby the carriages have the form of radial arms and are rotated, using stepper motors, around the center of the circular slablines,
and whereby each arm-carriage carries at its peripheral end a disc-formed reflective probe, which it moves along the periphery of the associated slabline;
whereby the probe self-rotates eccentrically, driven by a stepper motor mounted at the peripheral end of the arm-carriage and is hereby penetrating into the slot of the associated slabline at adjustable distance from the center conductor, whereby the whole mechanism forms a planetary movement of the probes around the center of the slablines.

2. Conductive disc-probes for tuners as in claim 1 having a thickness matching the width of the slot of said slabline;
and a concave channel (groove) engraved on the disc periphery, parallel to the disc surface,
said groove diameter matching the diameter of the center conductor of said slabline;
and wherein the rotation axis is perpendicular to the axis of the slabline and placed eccentrically relative to the geometrical center of the disc.

3. Tuner as in claim 1, whereby each slabline is circular and comprises a top and bottom grounded conductive disc-shaped sidewall separated by a spacer disc;
and a center conductor forming a ring (toroid) concentric with and centered between the sidewall discs,
and whereby the assembly of the two sandwiched slablines comprises a total of three sidewall discs, a top disc, a common middle disc and a bottom disc;
and whereby the sidewalls are separated by disc spacers, one spacer between the top and the middle sidewall and a second spacer between the middle and the bottom sidewall;
and whereby the thickness of the spacer discs and the dimensions of the vertical transition are selected to create a constant characteristic impedance;
and whereby the spacer discs have a diameter smaller than the diameter of the center conductor ring by at least twice their own thickness.

4. Tuner as in claim 3, whereby the carriages are mobile radial arms rotating around the center of the circular slablines and sliding on the top surface of the top slabline and on the bottom surface of the bottom slabline, each said arm being driven using a first stepper motor;
and a disc-shaped metallic probe mounted at the end of said arm,
each said probe being a conductive disc having approximately the same thickness as the width of the slabline channel and a concave periphery matching the diameter of the center conductor of said slabline;
and being self-rotated eccentrically by a second stepper motor mounted at the peripheral end of the rotating arm hereby penetrating into the slot of the associated slabline at adjustable distance from the center conductor.

5. Input and output coaxial ports for the slabline of claim 3 use coaxial connectors, said connectors comprising a center conductor and a grounded external cylindrical mantle,
said center conductor forming a continuation of the circular center conductor of the slabline and being bent by 90 degrees from its circular path towards the periphery of the slabline disc's peripheral surface,
and whereby said coaxial connectors are mounted flat against the peripheral surface.

6. Double-decker circular slabline for tuner as in claim 3 comprising two stacked levels, each slabline level having a top metallic disc plate and a bottom metallic disc plate,
and a spacer disc between the plates,
and center conductor having a cylindrical cross section and a circular (toroid) shape and being centered between the disc plates and sharing the same center as the disc plates, the thickness of the spacer disc and the diameter of the center conductor being selected for creating the characteristic impedance Zo of the slabline.

7. A slabline as in claim 6 whereby the characteristic impedance Zo is equal to 50 Ohms.

8. RF transition between two stacked horizontal slablines, a top slabline 1 and a bottom slabline 2 sharing a common middle sidewall, comprises a vertical slabline section;

whereby the vertical slabline section comprises an opening in the middle sidewall through which the center conductor passes vertically from the top to the bottom slabline, and sidewalls perpendicular to the middle sidewall and parallel to the vertically traversing center conductor and its prolongation inside the top and bottom slablines;
and whereby the dimension of the opening and the distance between the vertical sidewalls are selected in order to create the same characteristic impedance as slablines 1 and 2.

9. A calibration method for circular electro-mechanical impedance tuners having two rotating arms and associated independently eccentrically self-rotating disc probes 1 and 2 in a planetary movement, at a fundamental frequency Fo, or Fo and a harmonic frequency 2Fo or 3Fo, comprising the following steps;

a) preparation step, hereby the tuner is connected to a pre-calibrated vector network analyzer (VNA) and a control computer;
b) initialization step, hereby the tuner is initialized, i.e. the mobile arms are rotated to initial angles $\Psi o1$ and $\Psi o2$ and the disc-probes are rotated out of the slablines to initial angles $\Phi o1$ and $\Phi o2$ creating negligible reflection;
c) creating the initialization matrix of the tuner by measuring its two-port s-parameters and saving in matrix S[0] at frequencies Fo, or Fo and 2Fo, or Fo and 3Fo;
d) scaling step at Fo, hereby each disc-probe is rotated progressively into the slot of the slabline, the reflection factor S11 is measured at the tuner test port at a number of rotation angles $\Phi.k.i$ and associated $S11.k.i$ values between minimum reflection and maximum reflection are saved in memory, whereby $0<i\leq N$, and k is the probe index, 1 or 2;
e) calibration step, hereby tuner s-parameters S11.k.ij, S12.k.ij=S21.k.ij, S22.k.ij are measured by and retrieved from the VNA for frequencies Fo and 2Fo or 3Fo at a multitude of combinations {i, j} of the saved rotation angles $\Phi.k.i$ of probe k, between values $\Phi.k.i.min$ and $\Phi.k.i.max$, whereby $\Phi.k.i.min$ corresponds to the angle of minimum reflection and $\Phi.k.i.max$ to the angle of maximum reflection of the probe,
and a multitude of rotation angles $\Psi.k.j$ of the mobile arm, between $\Psi.k.j.min=0$ and at least $\Psi.k.j.max=\lambda/(2\pi R)$, whereby R is the radius between the center of the slabline and the circular center conductor, and $\lambda$ is the wavelength at the selected frequency Fo;
f) de-embedding step, hereby cascading s-parameters of probe 2 with the inverse of the initialization matrix S[0];
g) saving step, whereby s-parameters of steps (e) and (f) are cascaded in memory for all permutations of angles $\Phi$ and $\Psi$ of both probes and saved in a calibration file in a matrix format [S($\Phi.i, \Psi.j$)] at Fo, or Fo and 2Fo, or Fo and 3Fo, for later use.

10. Calibration method as in claim 9, whereby N is an integer number between 5 and 50.

11. Impedance synthesis algorithm for tuners calibrated at the frequencies Fi, as in claim 10, comprising the following steps:
- a) user definition of the target reflection factors (GAMMA.target(Fi));
- b) search algorithm, in computer memory, through the calibration data for identifying the calibrated S11(Fi) value (S11.c(Fi)), for which the vector difference |GAMMA.target(Fi)−S11.c(Fi)| is minimum;
- c) search of interpolated s-parameter data points, in computer memory, alternative for probe angle Φ, and arm angle Ψ for each probe, in the vicinity of the calibrated point S11.c(Fi) for S11 values for which the vector difference |GAMMA.target(Fi)−S11(Fi)| is minimum;
- d) determine the arm angles Ψ.1 and Ψ.2 and the probe angles Φ.1 and Φ.2 corresponding to the reflection factor S11 fund in step (c);
- e) rotate the mobile arms to the corresponding angles Ψ and the probes to the angles Φ found in step (d).

\* \* \* \* \*